US011665886B2

(12) United States Patent
Wu

(10) Patent No.: US 11,665,886 B2
(45) Date of Patent: May 30, 2023

(54) METHOD FOR FABRICATING SEMICONDUCTOR DEVICE WITH CARBON LINER OVER GATE STRUCTURE

(71) Applicant: NANYA TECHNOLOGY CORPORATION, New Taipei (TW)

(72) Inventor: Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/544,676

(22) Filed: Dec. 7, 2021

(65) Prior Publication Data

US 2022/0238529 A1 Jul. 28, 2022

Related U.S. Application Data

(62) Division of application No. 17/158,564, filed on Jan. 26, 2021, now Pat. No. 11,456,298.

(51) Int. Cl.
*H10B 12/00* (2023.01)

(52) U.S. Cl.
CPC .......... *H10B 12/315* (2023.02); *H10B 12/05* (2023.02); *H10B 12/482* (2023.02); *H10B 12/485* (2023.02)

(58) Field of Classification Search
CPC ......... H01L 27/10814; H01L 27/10873; H01L 27/10885; H01L 27/10888; H10B 12/05; H10B 12/485; H01B 12/315

USPC .................................................. 257/751, 906
See application file for complete search history.

(56) References Cited

U.S. PATENT DOCUMENTS

| 6,483,140 B1 | 11/2002 | Matsuoka et al. |
| 9,450,095 B1 | 9/2016 | Bergendahl et al. |
| 2002/0132397 A1* | 9/2002 | Weimer ............. H01L 23/3192 257/E21.654 |

OTHER PUBLICATIONS

Office Action dated Aug. 12, 2022 related to Taiwanese Application No. 110130938.
Office Action dated Mar. 2, 2022 related to U.S. Appl. No. 17/158,564, wherein this application is a Div of U.S. Appl. No. 17/158,564.

* cited by examiner

*Primary Examiner* — Hoai V Pham
(74) *Attorney, Agent, or Firm* — Xuan Zhang

(57) ABSTRACT

The present disclosure provides a method for fabricating a semiconductor device with a carbon liner over a gate structure. The method includes forming a first gate structure over a semiconductor substrate; forming a first source/drain region in the semiconductor substrate, wherein the first source/drain region is adjacent to the first gate structure; conformally depositing a carbon liner over the first gate structure and the semiconductor substrate; forming a dielectric layer over the carbon liner; and forming a bit line contact penetrating through the dielectric layer and the carbon liner, wherein the bit line contact is electrically connected to the first source/drain region, and wherein the bit line contact is separated from the first gate structure by the carbon liner.

7 Claims, 22 Drawing Sheets

METHOD FOR FABRICATING SEMICONDUCTOR DEVICE WITH CARBON LINER OVER GATE STRUCTURE

CROSS-REFERENCE TO RELATED APPLICATION

This application is a divisional application of U.S. Non-Provisional application Ser. No. 17/158,564 filed on Jan. 26, 2021, which is incorporated herein by reference in its entirety.

TECHNICAL FIELD

The present disclosure relates to a method for fabricating a semiconductor device, and more particularly, to a method for fabricating a semiconductor device with a carbon liner over a gate structure.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as short circuit and leakage current between neighboring conductive features, which results from the damage in the dielectric layer between the neighboring conductive features. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a gate structure disposed over a semiconductor substrate. The semiconductor device also includes a carbon liner covering a top surface and sidewalls of the gate structure and a top surface of the semiconductor substrate. The semiconductor device further includes a bit line contact disposed over the semiconductor substrate. The bit line contact extends over the gate structure, and the bit line contact is electrically separated from the gate structure by the carbon liner.

In an embodiment, the semiconductor device further includes a dielectric layer disposed over the carbon liner, wherein the dielectric layer and the carbon liner are made of different materials. In an embodiment, the semiconductor device further includes a patterned mask disposed over the dielectric layer, wherein a top surface of the patterned mask is substantially level with a top surface of the bit line contact. In an embodiment, an interface between the dielectric layer and the bit line contact is substantially aligned with an interface between the patterned mask and the bit line contact.

In an embodiment, the semiconductor device further includes a first source/drain region and a second source/drain region disposed in the semiconductor substrate and on opposite sides of the gate structure, and a bit line disposed over the bit line contact, wherein the bit line is electrically connected to the first source/drain region through the bit line contact. In an embodiment, the semiconductor device further includes a capacitor contact disposed over the second source/drain region and penetrating through the carbon liner, and a capacitor disposed over the capacitor contact, wherein the capacitor is electrically connected to the second source/drain region through the capacitor contact.

In another embodiment of the present disclosure, a semiconductor device is provided. The semiconductor device includes a first gate structure and a second gate structure disposed over a semiconductor substrate. The semiconductor device also includes a bit line contact disposed over the semiconductor substrate and between the first gate structure and the second gate structure. The semiconductor device further includes a carbon liner covering the first gate structure and the second gate structure. The bit line contact is electrically separated from the first gate structure and the second gate structure by the carbon liner. In addition, the semiconductor device includes a dielectric layer disposed over the carbon liner. The bit line contact penetrates through the dielectric layer.

In an embodiment, a top surface and sidewalls of the first gate structure and a top surface and sidewalls of the second gate structure are entirely covered by the carbon liner. In an embodiment, the bit line contact extends onto a top surface of the carbon liner over the first gate structure and a top surface of the carbon liner over the second gate structure.

In an embodiment, the semiconductor device further includes a first source/drain region disposed in the semiconductor substrate and between the first gate structure and the second gate structure, and a bit line disposed over the bit line contact, wherein the bit line is electrically connected to the first source/drain region through the bit line contact. In an embodiment, the semiconductor device further includes a second source/drain region disposed in the semiconductor substrate, wherein the first gate structure is between the first source/drain region and the second source/drain region, and a capacitor contact penetrating through the dielectric layer and the carbon liner to electrically connect to the second source/drain region.

In yet another embodiment of the present disclosure, a method for fabricating a semiconductor device is provided. The method includes forming a first gate structure over a semiconductor substrate, and forming a first source/drain region in the semiconductor substrate. The first source/drain region is adjacent to the first gate structure. The method also includes conformally depositing a carbon liner over the first gate structure and the semiconductor substrate, and forming a dielectric layer over the carbon liner. The method further includes forming a bit line contact penetrating through the dielectric layer and the carbon liner. The bit line contact is electrically connected to the first source/drain region, and the bit line contact is separated from the first gate structure by the carbon liner.

In an embodiment, a top surface and sidewalls of the first gate structure are entirely covered by the carbon liner after the bit line contact is formed. In an embodiment, before the forming the bit line contact, the method further includes performing a first etching process to form an opening in the dielectric layer, wherein a portion of the carbon liner on sidewalls of the first gate structure is exposed by the opening, and a top surface of a portion of the carbon liner covering the first source/drain region is exposed by the opening. In addition, the method includes performing a second etching process to remove the portion of the carbon liner covering the first source/drain region. In an embodiment, the first etching process and the second etching process are dry etching processes. In an embodiment, an etching selectivity exists between the carbon liner and the dielectric layer, such that the first source/drain region is entirely covered by the portion of the carbon liner during the first etching process. In an embodiment, before the forming the bit line contact, the method further includes performing a third etching process on the dielectric layer to broaden an upper portion of the opening such that a topmost surface of the carbon liner is partially exposed, wherein the first gate structure is entirely covered by the carbon liner during the third etching process.

In an embodiment, the bit line contact is formed in the opening after the upper portion of the opening is broadened, and the bit line contact covers the topmost surface of the carbon liner. In an embodiment, the method further includes forming a second source/drain region in the semiconductor substrate, wherein the first source/drain region and the second source/drain region are on opposite sides of the first gate structure. In addition, the method includes forming a capacitor contact penetrating through the dielectric layer and the carbon liner, wherein the capacitor contact is electrically connected to the second source/drain region. In an embodiment, the method further includes forming a second gate structure between the semiconductor substrate and the carbon liner, wherein the first source/drain region is between the first gate structure and the second gate structure, and the bit line contact is separated from the second gate structure by the carbon liner.

Embodiments of a semiconductor device and method for fabricating the same are provided in the disclosure. In some embodiments, the semiconductor device includes a gate structure and a bit line contact disposed over a semiconductor substrate, and a carbon liner disposed over a top surface and sidewalls of the gate structure. The bit line contact is electrically separated from the gate structure by the carbon liner. The carbon liner is configured to protect the gate structure underneath from being exposed or damaged during the subsequent etching process for forming the bit line contact, thereby avoiding undesirable short circuit between the gate structure and the bit line contact.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
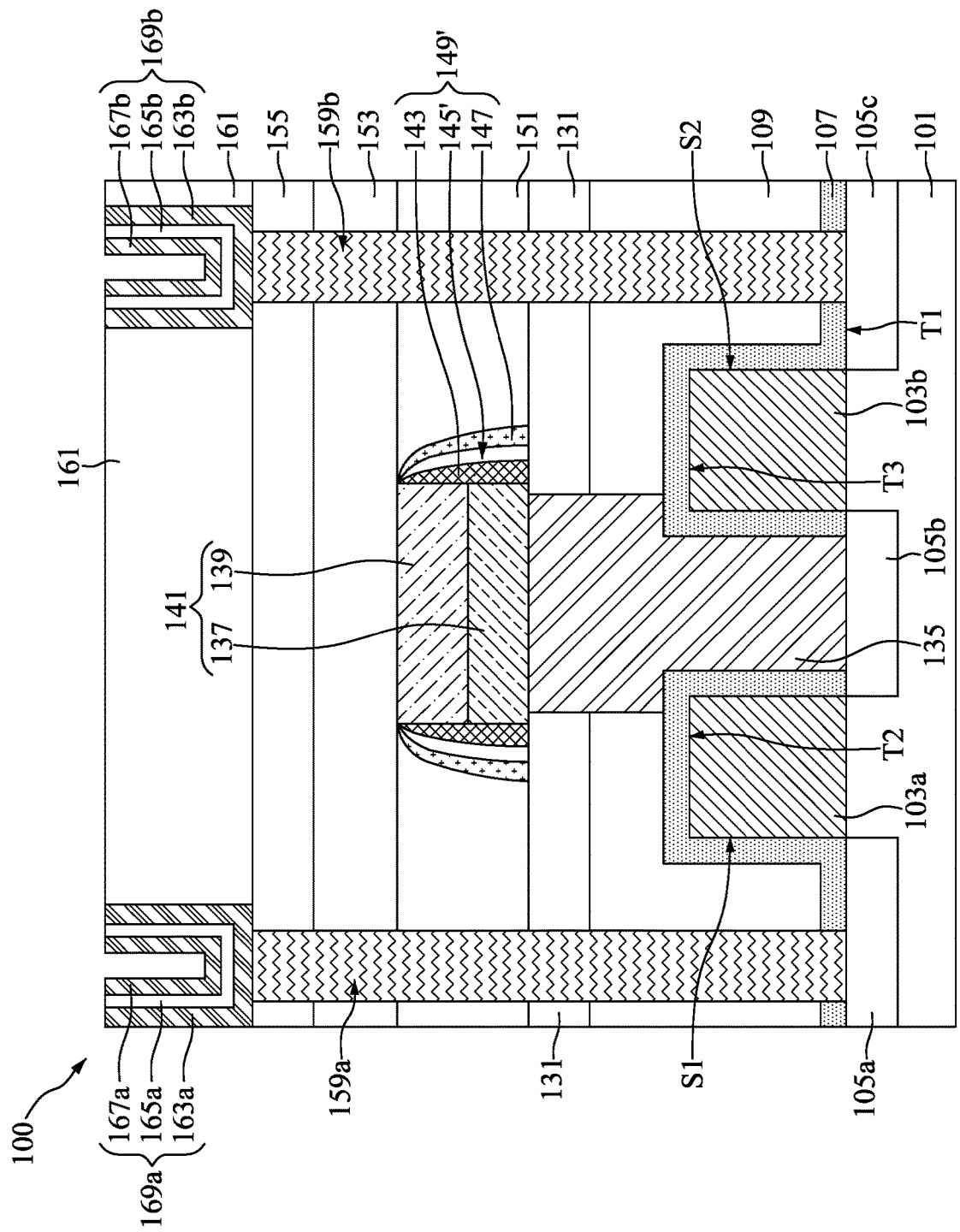
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or features relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a semiconductor substrate 101, source/drain regions 105a, 105b and 105c disposed in the semiconductor substrate 101, and gate structures 103a and 103b disposed over the semiconductor substrate 101. The source/drain regions 105a and 105b are located on opposite sides of the gate structure 103a, and the source/drain regions 105b and 105c are located on opposite sides of the gate structure 103b.

In some embodiments, the semiconductor device 100 includes a carbon liner 107 disposed over the gate structures 103a, 103b and the semiconductor substrate 101, a dielectric layer 109 disposed over the carbon liner 107, a patterned mask 131 disposed over the dielectric layer 109, and a bit line contact disposed between the gate structures 103a and 103b. In some embodiments, the sidewalls S1, S2 and the top surfaces T2, T3 of the gate structures 103a, 103b are entirely covered by the carbon liner 107, and the carbon liner 107 extends onto the top surface T1 of the semiconductor substrate 101. In some embodiments, the bit line contact 135 is separated from the gate structures 103a and 103b by the carbon liner 107.

Specifically, an upper portion of the bit line contact 135 has a width which is greater than a that of a lower portion of the bit line contact 135, and the upper portion of the bit line contact 135 extends onto the portion of the carbon liner 107 over the top surfaces T2, T3 of the gate structures 103a, 103b, in accordance with some embodiments. In some embodiments, the bit line contact 135 has a T-shaped profile in the cross-sectional view of FIG. 1. In some embodiments, the lower portion of the bit line contact 135 adjoins the portions of the carbon liner 107 on sidewalls of the gate structures 103a and 103b, and the upper portion of the bit line contact 135 adjoins the dielectric layer 109 and the patterned mask 131.

Moreover, the semiconductor device 100 includes a bit line 141 disposed over the bit line contact 135, a spacer structure 149' disposed on opposite sides of the bit line 141, and a dielectric layer 151 surrounding the spacer structure 149'. The bit line 141 includes a lower bit line layer 137 and an upper bit line layer 139. The spacer structure 149' includes inner spacers 143, air spacers 145' and outer spacers 147. In some embodiments, the air spacers 145' are sandwiched between the inner spacers 143 and the outer spacers 147.

The semiconductor device 100 also includes a dielectric layer 153 disposed over the dielectric layer 151, a patterned mask 155 disposed over the dielectric layer 153, and capacitor contacts 159a and 159b penetrating through the carbon liner 107, the patterned masks 131 and 155, and the dielectric layers 109, 151 and 153. The semiconductor device 100 further includes a dielectric layer 161 disposed over the patterned mask 155, and capacitors 169a and 169b disposed in the dielectric layer 161. In some embodiments, the capacitors 169a and 169b are metal-insulator-metal (MIM) capacitors. The capacitor 169a includes conductive layers 163a and 167a, and a dielectric layer 165a sandwiched between the conductive layers 163a and 167a. In addition, the capacitor 169b includes conductive layers 163b and 167b, and a dielectric layer 165b sandwiched between the conductive layers 163b and 167b.

In some embodiments, the bit line 141 is electrically connected to the source/drain region 105b through the bit line contact 135, the capacitor 169a is electrically connected to the source/drain region 105a through the capacitor contact 159a, and the capacitor 169b is electrically connected to the source/drain region 105b through the capacitor contact 159b. In some embodiments, the semiconductor device 100 is a dynamic random access memory (DRAM), the source/drain regions 105a, 105b, 105c are located in an active area, and the gate structures 103a and 103b are parallel word line (WL) structures crossing the active area.

Figure 2:
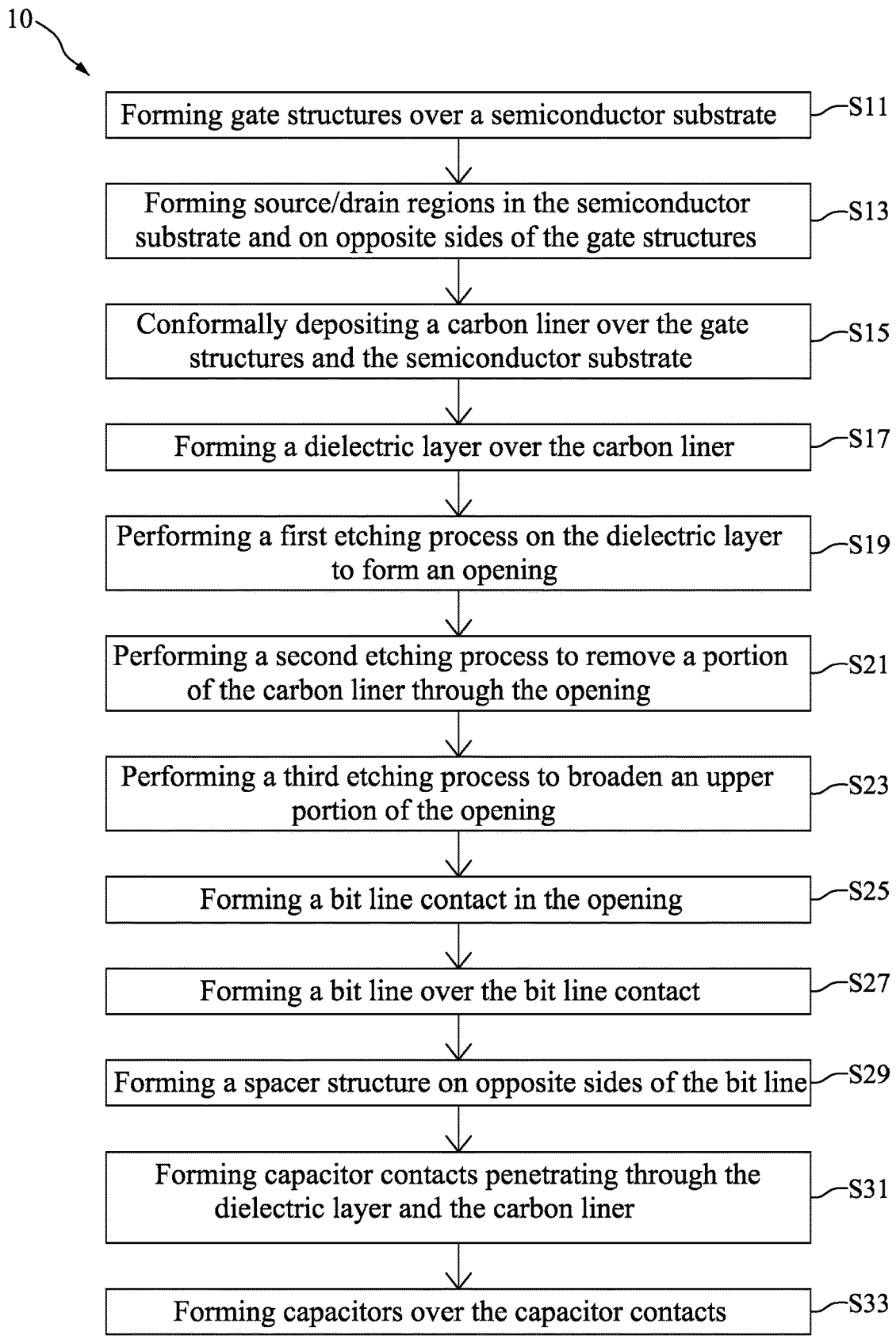
FIG. 2 is a flow diagram illustrating a method for fabricating a semiconductor device, in accordance with some embodiments.

FIG. 2 is a flow diagram illustrating a method 10 for forming a semiconductor device (e.g., the semiconductor device 100), and the method 10 includes steps S11, S13, S15, S17, S19, S21, S23, S25, S27, S29, S31 and S33, in accordance with some embodiments. The steps S11 to S33 of FIG. 2 are elaborated in connection with the following figures.

Figure 3:
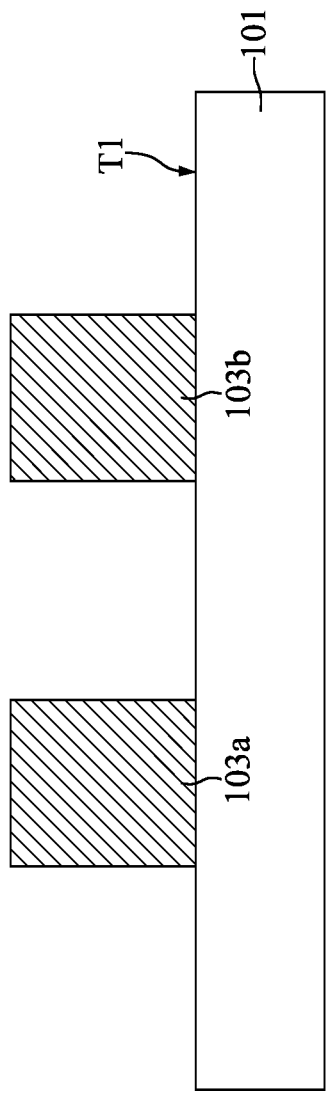
FIG. 3 is a cross-sectional view illustrating an intermediate stage of forming gate structures over a semiconductor substrate during the formation of the semiconductor device, in accordance with some embodiments.
Figure 14:
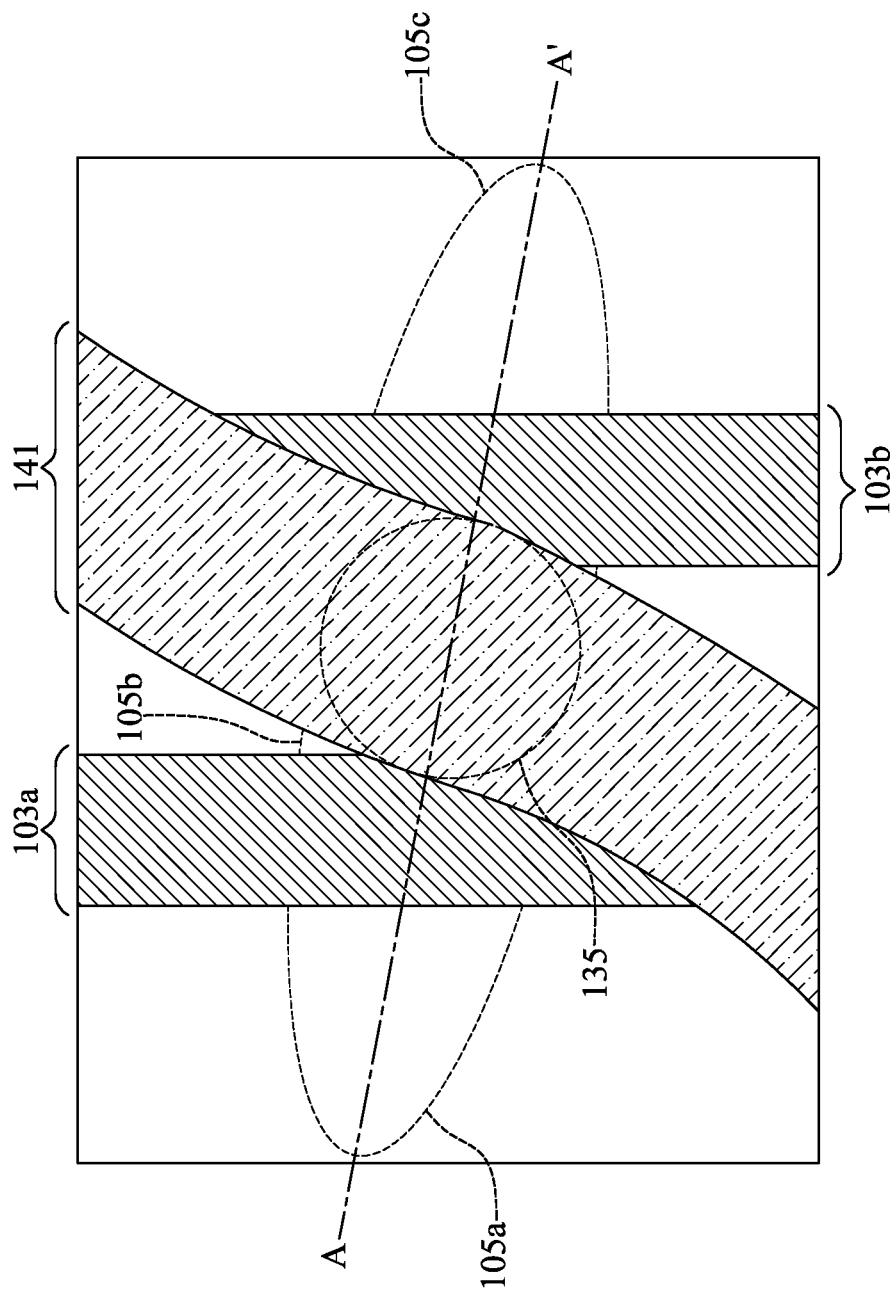
FIG. 14 is a top view illustrating an intermediate stage of forming a bit line over the bit line contact during the formation of the semiconductor device, in accordance with some embodiments.
Figure 15:
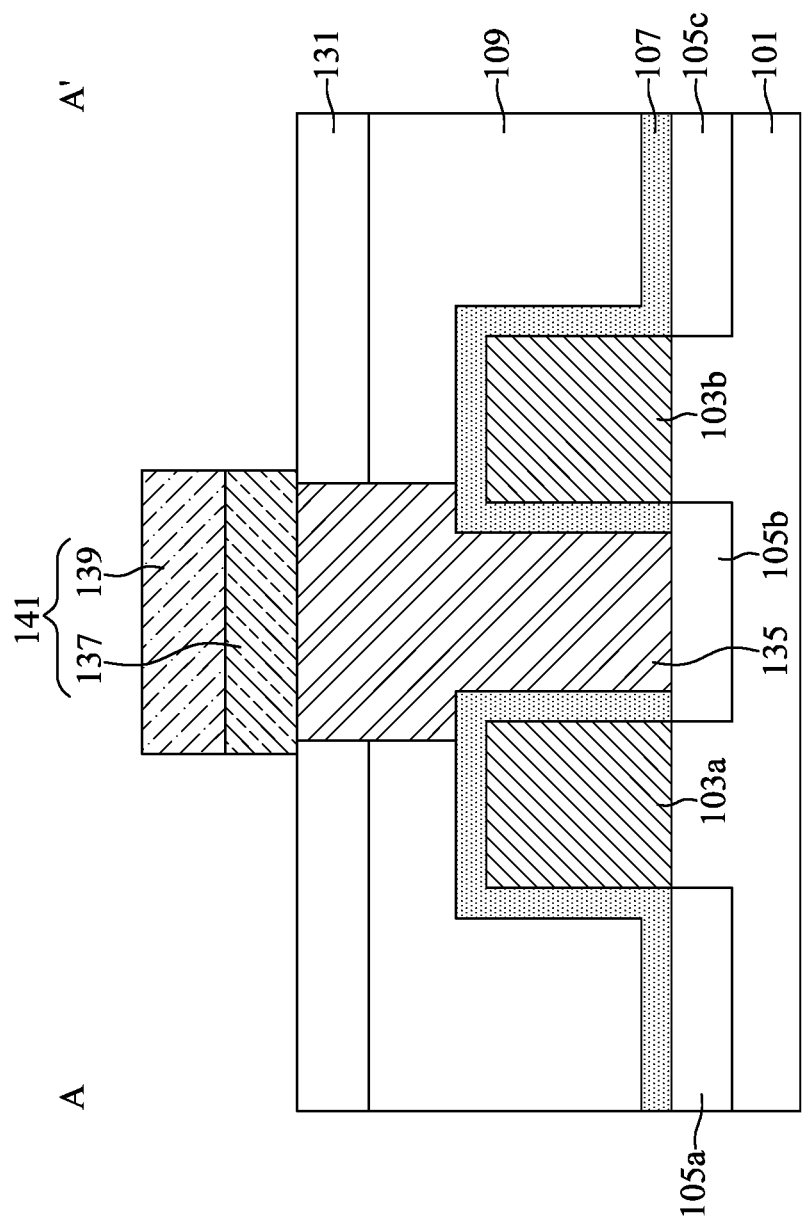
FIG. 15 is a cross-sectional view illustrating an intermediate stage during the formation of the semiconductor device along the sectional line A-A' of FIG. 14, in accordance with some embodiments.
Figure 21:
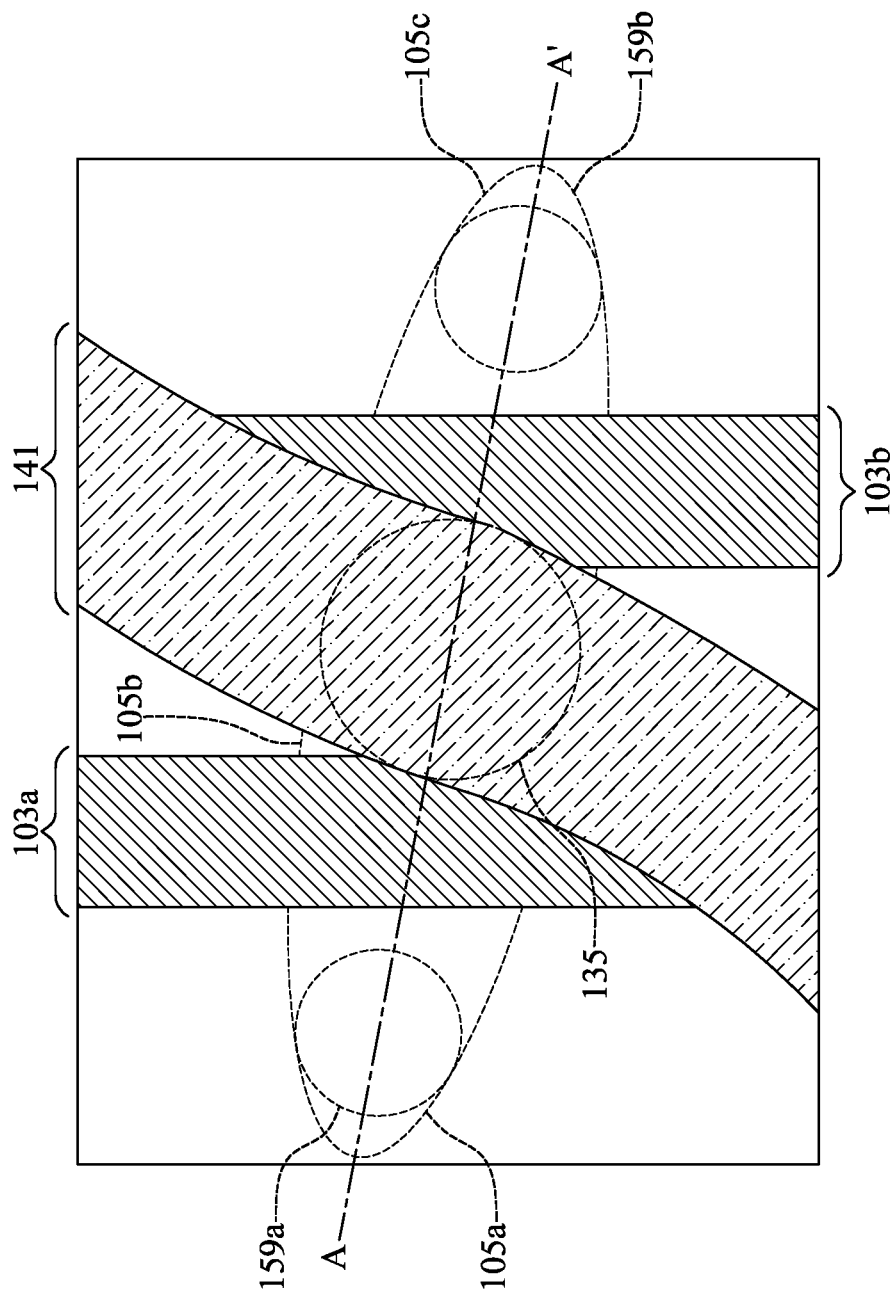
FIG. 21 is a top view illustrating an intermediate stage of forming capacitor contacts in the openings during the formation of the semiconductor device, in accordance with some embodiments.
Figure 22:
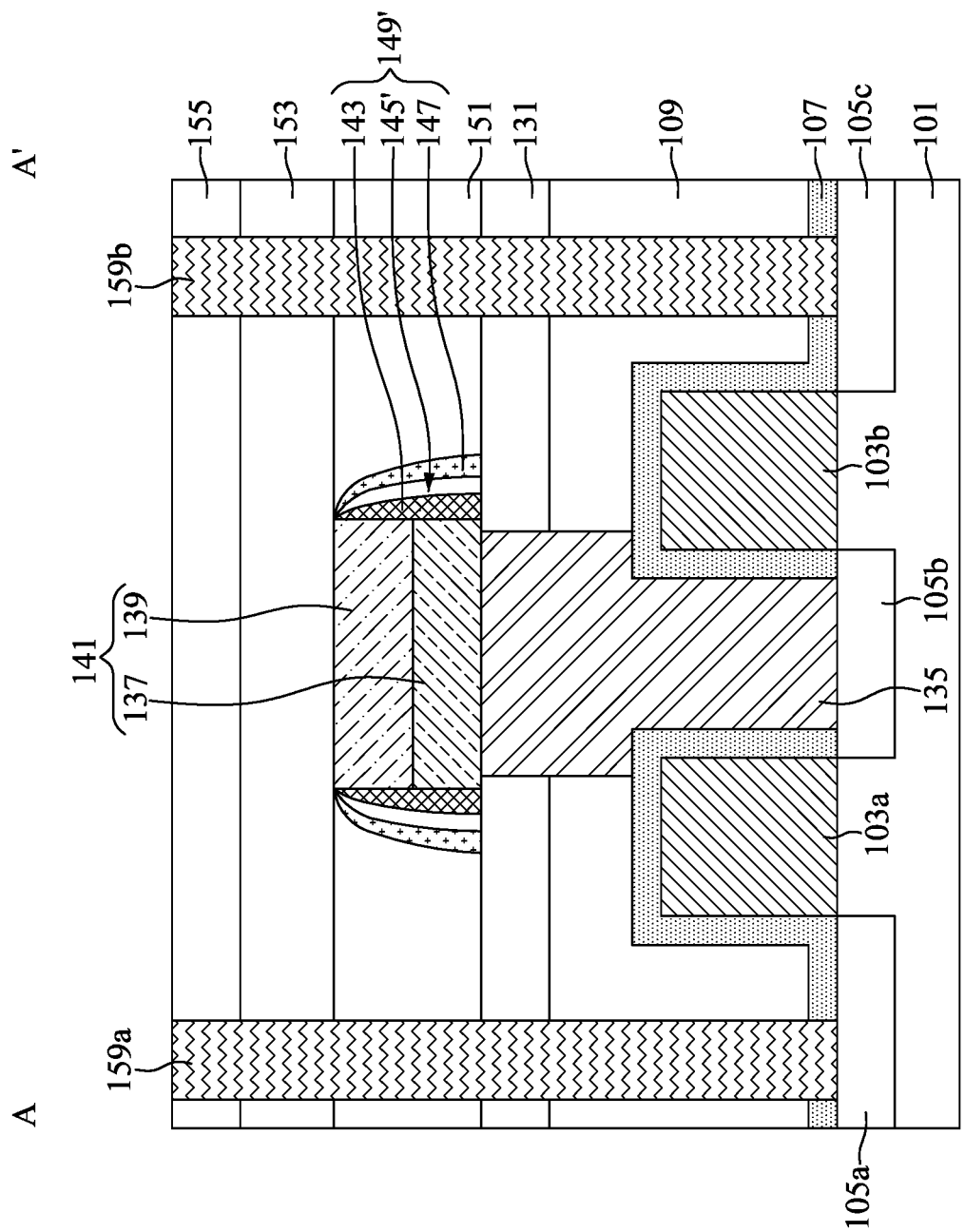
FIG. 22 is a cross-sectional view illustrating an intermediate stage during the formation of the semiconductor device along the sectional line A-A' of FIG. 21, in accordance with some embodiments.

FIGS. 3-13, 15-20 and 22 are cross-sectional views illustrating intermediate stages during the formation of the semiconductor device 100, in accordance with some embodiments. FIGS. 14 and 21 are top views illustrating intermediate stages during the formation of the semiconductor device 100, wherein FIG. 15 is a cross-sectional view taken along the sectional line A-A' of FIG. 14, and FIG. 22 is a cross-sectional view taken along the sectional line A-A' of FIG. 21. As shown in FIG. 3, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 3, the gate structures 103a and 103b are formed over the semiconductor substrate 101, in accordance with some embodiments. The respective step is illustrated as the step S11 in the method 10 shown in FIG. 2. In some embodiments, each of the gate structures 103a and 103b may be a single layer or multiple layers. In some embodiments, the gate structures 103a and 103b include aluminum (Al), copper (Cu), tungsten (W), titanium (Ti), tantalum (Ta), or another applicable conductive material.

The gate structures 103a and 103b may be formed by depositing a conductive material (not shown) over the top surface T1 of the semiconductor substrate 101, and patterning the conductive material to form the gate structures 103a and 103b. In some embodiments, the gate structures 103a and 103b are substantially parallel to each other. Within the context of this disclosure, the word "substantially" means preferably at least 90%, more preferably 95%, even more preferably 98%, and most preferably 99%.

Figure 4:
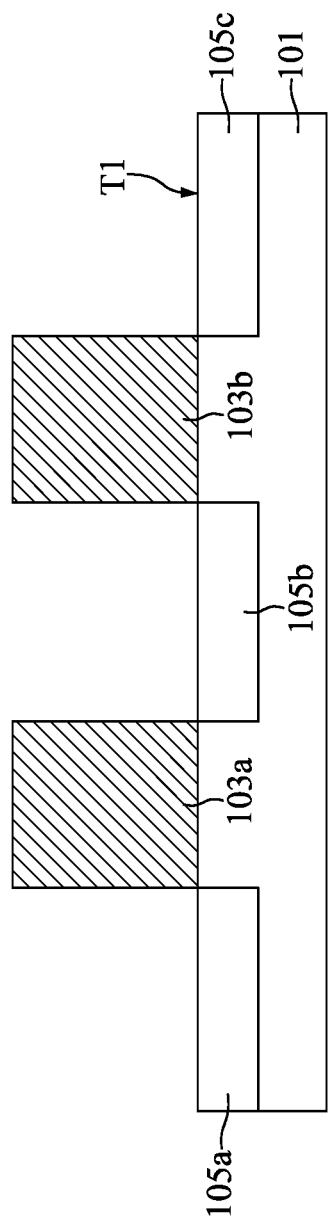
FIG. 4 is a cross-sectional view illustrating an intermediate stage of forming source/drain regions in the semiconductor substrate during the formation of the semiconductor device, in accordance with some embodiments.

Next, the source/drain regions 105a, 105b and 105c are formed in the semiconductor substrate 101 and on opposite sides of the gate structures 103a and 103b, as shown in FIG. 4 in accordance with some embodiments. The respective step is illustrated as the step S13 in the method 10 shown in FIG. 2. In some embodiments, active areas (not shown) are defined by isolation structure(s) (not shown) formed in the semiconductor substrate 101, and the source/drain regions 105a, 105b and 105c are formed in the active areas.

In some embodiments, the source/drain regions 105a, 105b and 105c are formed by one or more ion implantation processes. For example, P-type dopants, such as boron (B), gallium (Ga), or indium (In), or N-type dopants, such as phosphorous (P) or arsenic (As), can be implanted in the active areas to form the source/drain regions 105a, 105b and 105c, depending on the conductivity type of the semiconductor device 100. In the present embodiment, the source/drain regions 105a, 105b and 105c are implanted by using the gate structures 103a and 103b as a mask. However, any other suitable process may alternatively be used to form the source/drain regions 105a, 105b, 105c and the gate structures 103a, 103b. For example, in other embodiments, the source/drain regions 105a, 105b and 105c are formed prior to forming the gate structures 103a and 103b.

Figure 5:
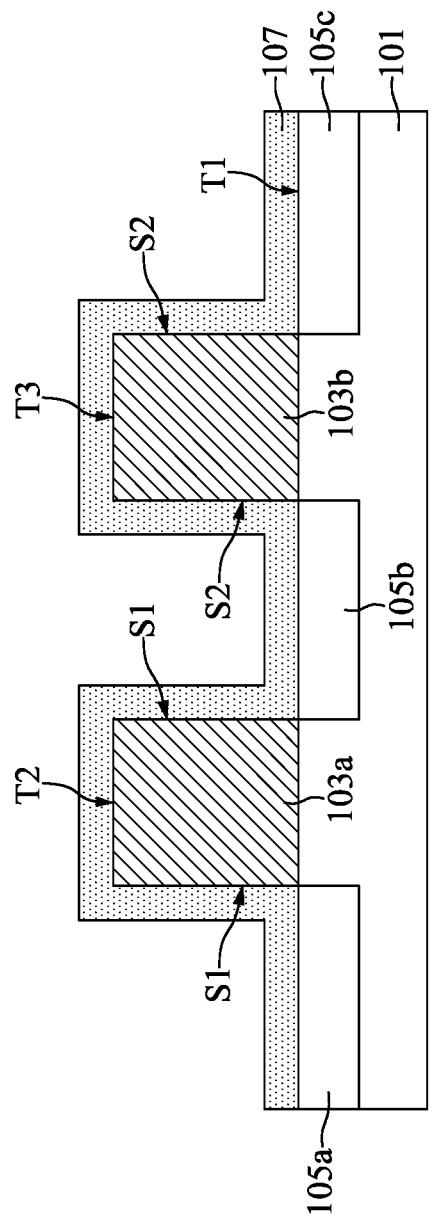
FIG. 5 is a cross-sectional view illustrating an intermediate stage of forming a carbon liner covering the gate structures and the semiconductor substrate during the formation of the semiconductor device, in accordance with some embodiments.

Subsequently, the carbon liner 107 is conformally deposited over the structure of FIG. 4, as shown in FIG. 5 in accordance with some embodiments. The respective step is illustrated as the step S15 in the method 10 shown in FIG. 2. In some embodiments, the top surface T1 of the semiconductor substrate 101 (also referred to as the top surfaces of the source/drain regions 105a, 105b and 105c), the sidewalls S1 and the top surface T2 of the gate structure 103a, and the sidewalls S2 and the top surface T3 of the gate structure 103b are covered by the carbon liner 107.

In some embodiments, the carbon liner 107 is made of carbon (C). In some other embodiments, the carbon liner 107 is made of a carbon-containing material. Moreover, the carbon liner 107 may be formed using a conformal depositing method, such as a chemical vapor deposition (CVD) process, a physical vapor deposition (PVD) process, or an atomic layer deposition (ALD) process.

Figure 6:
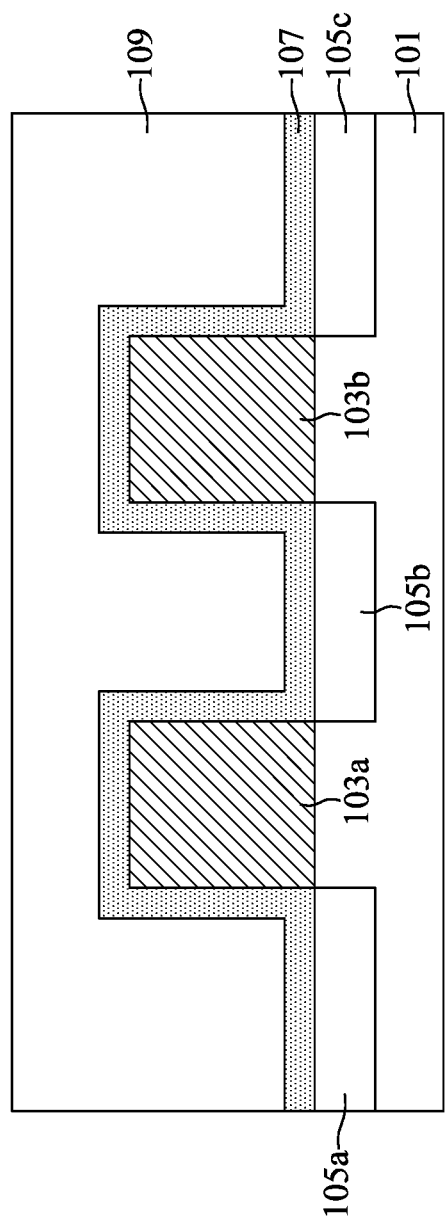
FIG. 6 is a cross-sectional view illustrating an intermediate stage of forming a dielectric layer over the carbon liner during the formation of the semiconductor device, in accordance with some embodiments.

Then, the dielectric layer 109 is formed over the carbon liner 107, as shown in FIG. 6 in accordance with some embodiments. The respective step is illustrated as the step S17 in the method 10 shown in FIG. 2. In some embodiments, the dielectric layer 109 may be a single layer or multiple layers.

In some embodiments, the dielectric layer 109 includes silicon oxide, silicon nitride, silicon oxynitride, or another applicable dielectric material. In some embodiments, the dielectric layer 109 and the carbon liner 107 are made of different materials. Specifically, the dielectric layer 109 is formed from a material that has a high etching selectivity during the subsequent etching process compared to the material of the carbon liner 107.

Figure 7:
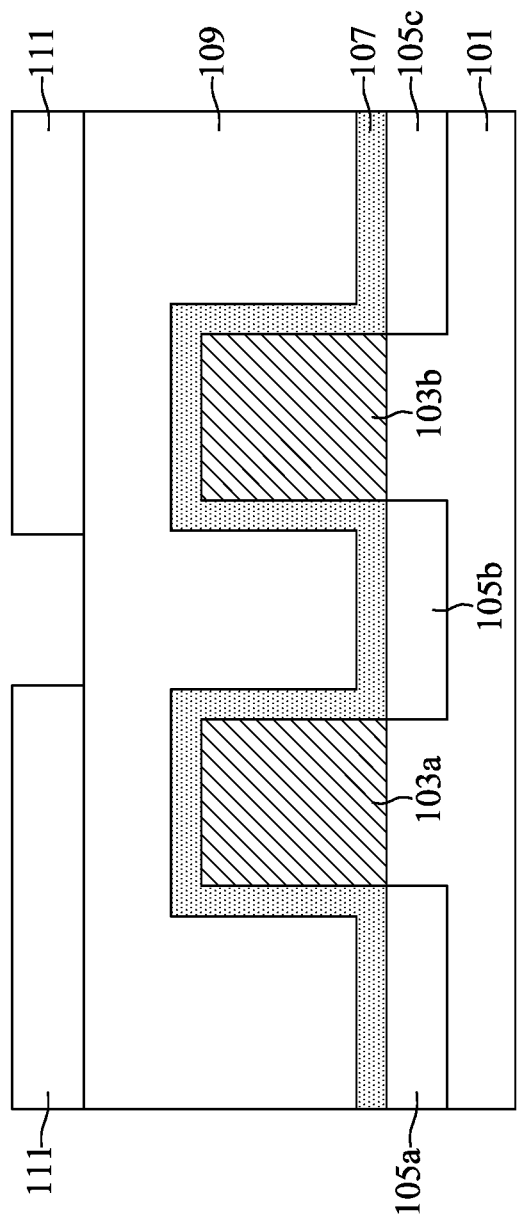
FIG. 7 is a cross-sectional view illustrating an intermediate stage of forming a patterned mask over the dielectric layer during the formation of the semiconductor device, in accordance with some embodiments.

Next, a patterned mask 111 is formed over the dielectric layer 109, as shown in FIG. 7 in accordance with some embodiments. In some embodiments, the patterned mask 111 has an opening exposing the portion of the dielectric layer 109 directly above the source/drain region 105b.

Figure 8:
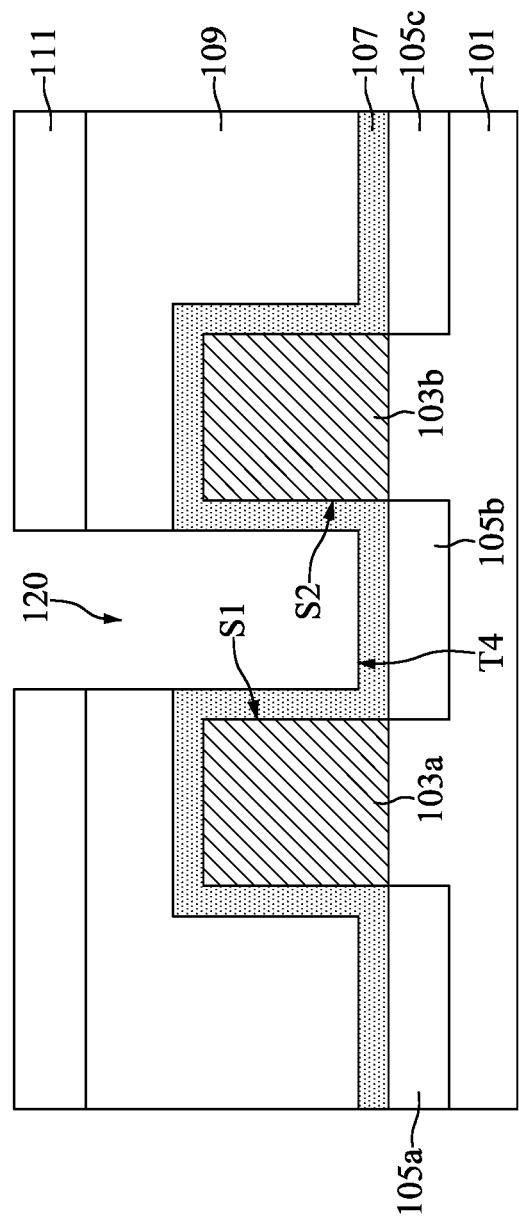
FIG. 8 is a cross-sectional view illustrating an intermediate stage of performing a first etching process to form an opening during the formation of the semiconductor device, in accordance with some embodiments.

Subsequently, an etching process (also referred to as a first etching process) is performed on the dielectric layer 109 to form an opening 120 using the patterned mask 111 as a mask, as shown in FIG. 8 in accordance with some embodiments. The respective step is illustrated as the step S19 in the method 10 shown in FIG. 2. In some embodiments, the portions of the carbon liner 107 on the sidewalls S1, S2 of the gate structures 103a, 103b and the top surface T4 of the portion of the carbon liner 107 covering the source/drain region 105b are exposed by the opening 120.

Since the carbon liner 107 can provide a good adhesion between the carbon liner 107 and the gate structures 103a and 103b, and a high etching selectivity exists between the carbon liner 107 and the dielectric layer 109, the carbon liner 107 can be used as an etch stop layer in the etching process. As a result, the dielectric layer 109 is partially removed by the etching process, while the carbon liner 107 may be substantially left. In some embodiments, the etching process is a dry etching process.

Figure 9:
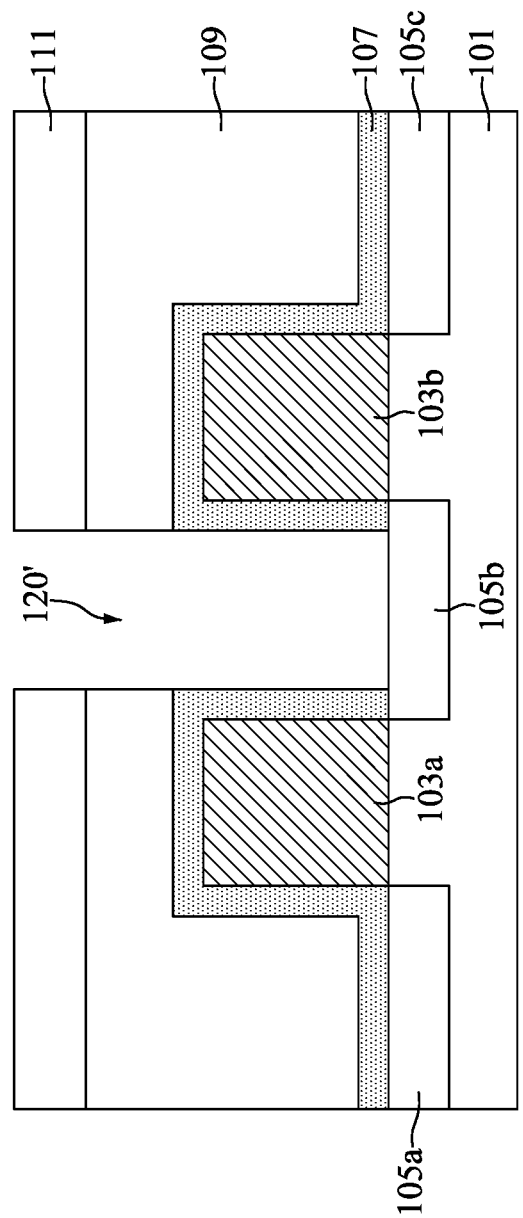
FIG. 9 is a cross-sectional view illustrating an intermediate stage of performing a second etching process to deepen the opening during the formation of the semiconductor device, in accordance with some embodiments.

Then, an etching process (also referred to as a second etching process) is performed to remove the portion of the carbon liner 107 covering the source/drain region 105b, as shown in FIG. 9 in accordance with some embodiments. The respective step is illustrated as the step S21 in the method 10 shown in FIG. 2. In some embodiments, the portion of the carbon liner 107 covering the source/drain region 105b is etched through the opening 120 (see FIG. 8).

In some embodiments, the opening 120 is deepened, such that an opening 120' exposing the source/drain region 105b is obtained. In some embodiments, the etching process is a dry etching process. After the opening 120' is obtained, the patterned mask 111 may be removed.

Figure 10:
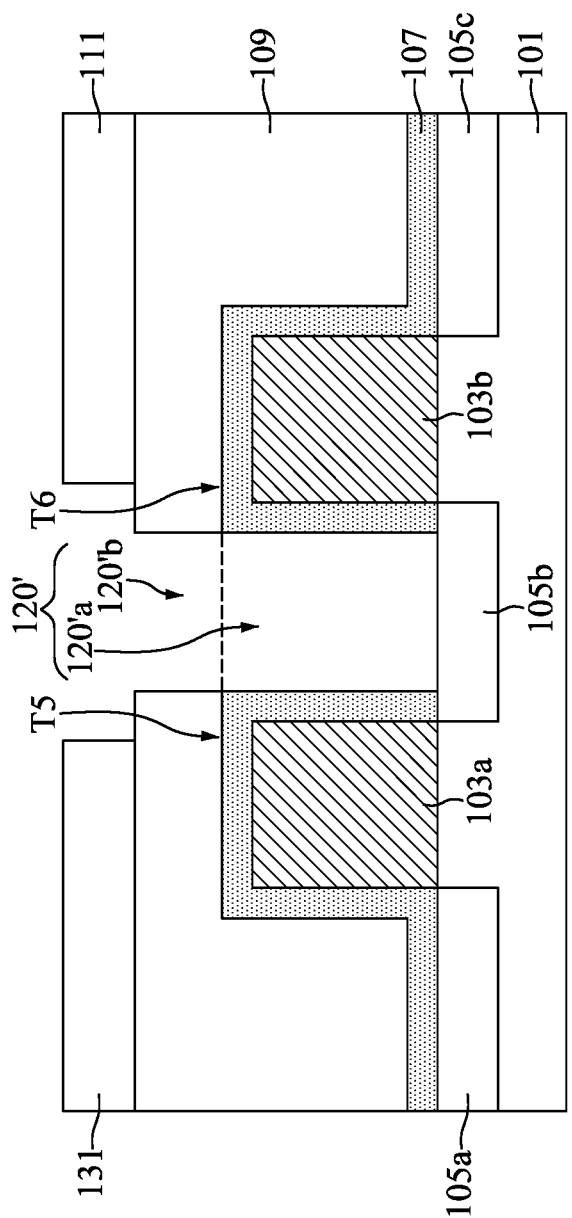
FIG. 10 is a cross-sectional view illustrating an intermediate stage of forming another patterned mask over the dielectric layer during the formation of the semiconductor device, in accordance with some embodiments.

After the patterned mask 111 is removed, another patterned mask 131 is formed over the dielectric layer 109, as shown in FIG. 10 in accordance with some embodiments. In some embodiments, the patterned mask 131 has an opening exposing the source/drain region 105b and a portion of the dielectric layer 109 surrounding the source/drain region 105b. In other words, the opening of the patterned mask 131 is greater than the opening of the patterned mask 111 (see FIG. 9).

Figure 11:
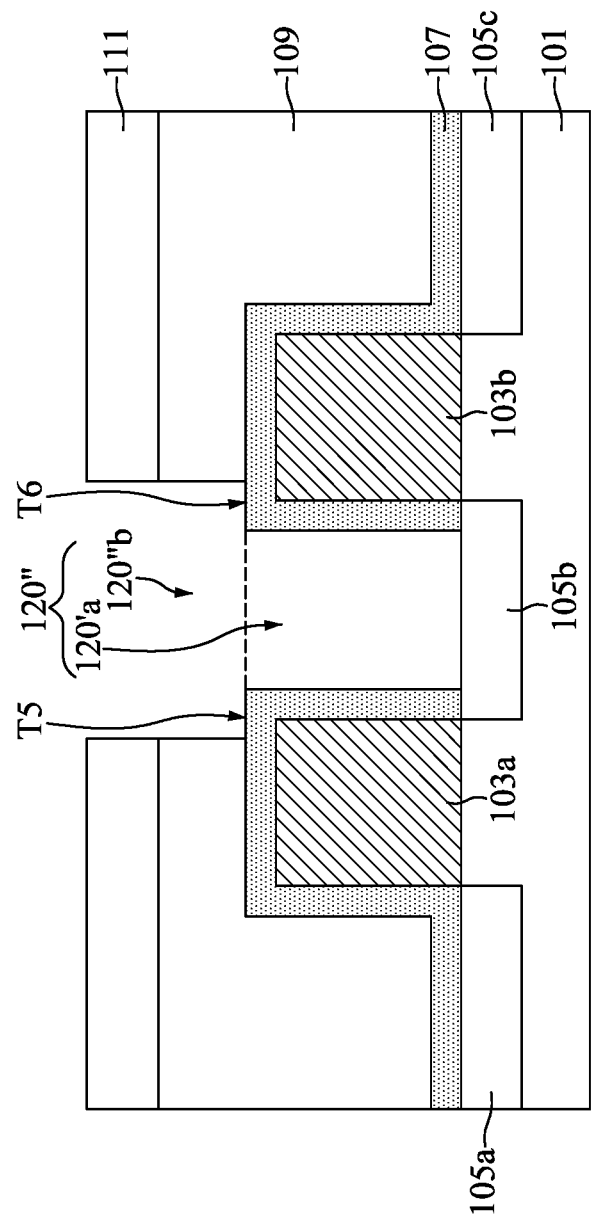
FIG. 11 is a cross-sectional view illustrating an intermediate stage of performing a third etching process to broaden an upper portion of the opening during the formation of the semiconductor device, in accordance with some embodiments.

An etching process (also referred to as a third etching process) is then performed on the dielectric layer 109 using the patterned mask 131 as a mask, as shown in FIG. 11 in accordance with some embodiments. The respective step is illustrated as the step S23 in the method 10 shown in FIG. 2. Referring to FIG. 10, the opening 120' has a lower portion 120'a and an upper portion 120'b defined by a dashed line aligned with the top surfaces T5, T6 of the portions of the carbon liner 107 over the gate structures 103a, 103b (the top surfaces T5, T6 may be referred to as the topmost surfaces of the carbon liner 107). The dashed line indicating the boundary of the upper portion 120'b and the lower portion 120'a of the opening 120' is used to clarify the disclosure. No obvious interface exists between upper portion 120'b and the lower portion 120'a of the opening 120'.

In some embodiments, the etching process is performed to broaden the upper portion 120'b of the opening 120', and the resulting structure is shown in FIG. 11, wherein a resulting opening 120" with a broadened upper portion 120"b is formed. As mentioned above, the carbon liner 107 can provide a good adhesion between the carbon liner 107 and the gate structures 103a and 103b, and the carbon liner 107 and the dielectric layer 109 have a high etching selectivity therebetween. Therefore, the carbon liner 107 is substantially not etched during the etching process, and the gate structures 103a and 103b are protected by the carbon liner 107.

In some embodiments, the top surface T5 and T6 of the portions of the carbon liner 107 over the gate structures 103a and 103b are exposed after the etching process. Moreover, as illustrated, the patterned mask 131 remains after the etching process. However, in other embodiments, the patterned mask 131 can be removed after the opening 120" is obtained.

Figure 12:
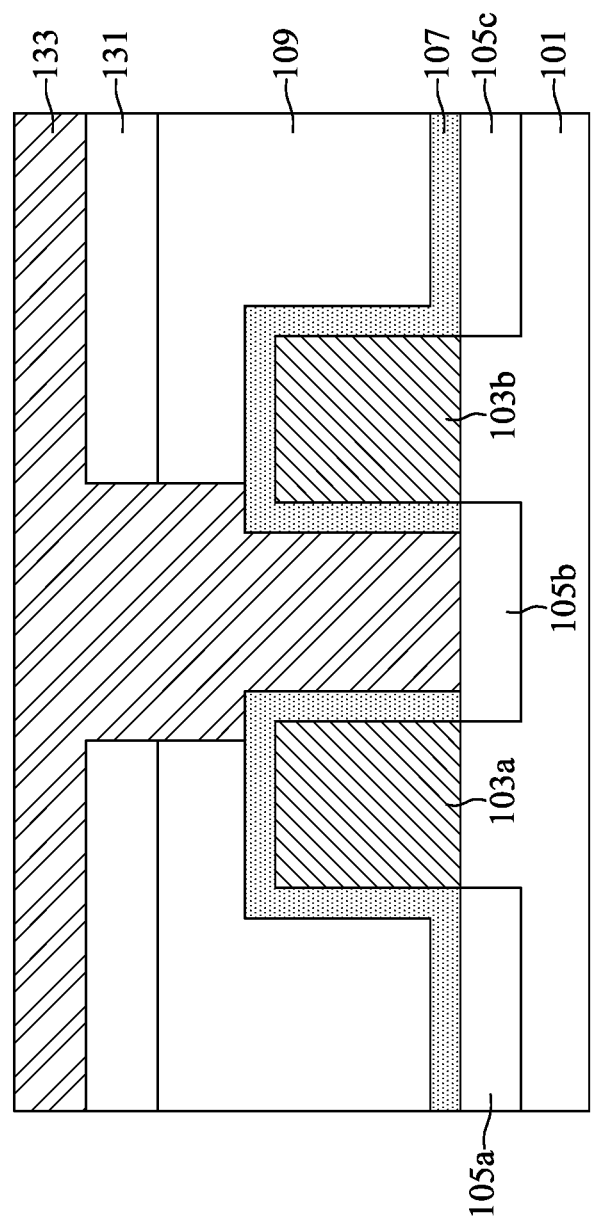
FIG. 12 is a cross-sectional view illustrating an intermediate stage of forming a conductive material in the opening and over the patterned mask during the formation of the semiconductor device, in accordance with some embodiments.

Subsequently, a conductive material 133 is formed in the opening 120" and extending over the patterned mask 131, as shown in FIG. 12 in accordance with some embodiments. In some embodiments, the conductive material 133 is made of a low resistivity conductive material, such as copper (Cu), tungsten (W), aluminum (Al), titanium (Ti), tantalum (Ta), gold (Au), silver (Ag), a combination thereof, or another applicable conductive material. The conductive material 133 may be formed by a CVD process, a PVD process, a sputtering process, a plating process, or another applicable process.

Figure 13:
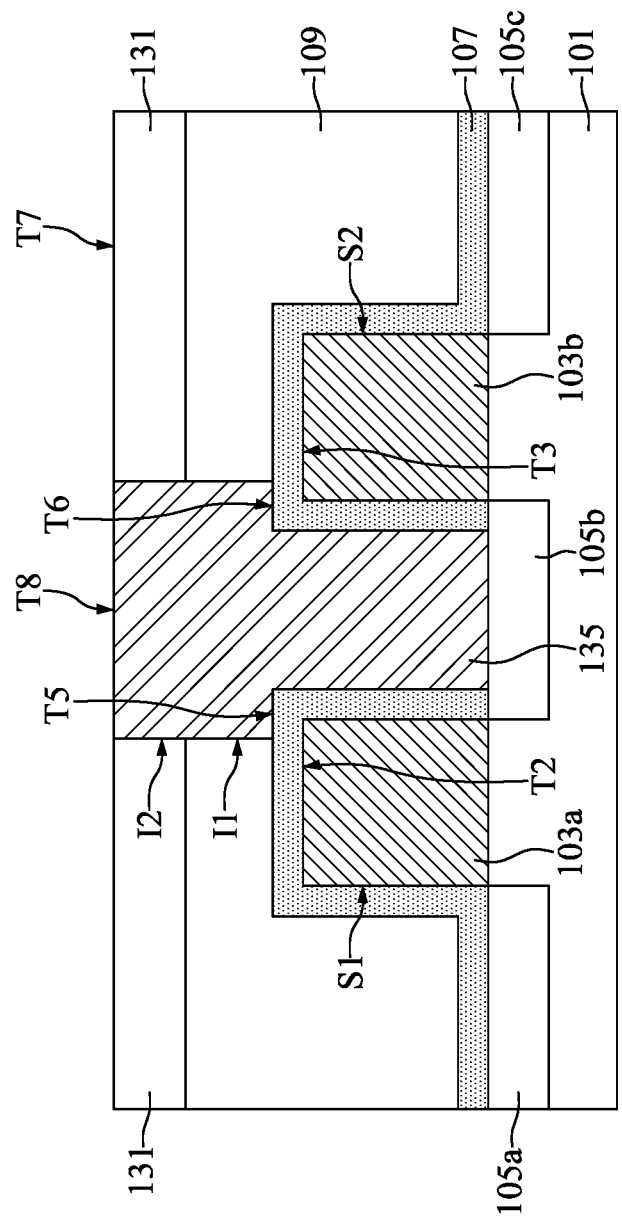
FIG. 13 is a cross-sectional view illustrating an intermediate stage of planarizing the conductive material to form a bit line contact in the opening during the formation of the semiconductor device, in accordance with some embodiments.

Next, a planarization process is performed to remove excess portions of the conductive material 133 over the patterned mask 131, such that the bit line contact 135 (i.e., the remaining portion of the conductive material 133) is obtained in the opening 120", as shown in FIG. 13 in accordance with some embodiments. The respective step is illustrated as the step S25 in the method 10 shown in FIG. 2. The planarization process may include a chemical mechanical polishing (CMP) process.

After the planarization process, the top surface T7 of the patterned mask 131 is exposed, and the top surface T8 of the bit line contact 135 is substantially level with the top surface T7 of the patterned mask 131, in accordance with some embodiments. Moreover, the top surfaces T5 and T6 of the portions of the carbon liner 107 over the gate structures 103a and 103b are covered by the bit line contact 135, in accordance with some embodiments. In addition, the interface I1 between the dielectric layer 109 and the bit line contact 135 is substantially aligned with the interface I2 between the patterned mask 131 and the bit line contact 135, as shown in FIG. 13 in accordance with some embodiments.

Then, the bit line 141 including the lower bit line layer 137 and the upper bit line layer 139 is formed over the bit line contact 135, as shown in FIGS. 14 and 15 in accordance with some embodiments. The respective step is illustrated as the step S27 in the method 10 shown in FIG. 2. In some embodiments, the bit line 141 is electrically connected to the source/drain region 105b through the bit line contact 135.

The formation of the bit line 141 may include forming a lower bit line material (not shown) covering the patterned mask 131 and the bit line contact 135, forming an upper bit line material (not shown) over the lower bit line material, forming a patterned mask (not shown) over the upper bit line material, and etching the upper bit line material and the lower bit line material by using the patterned mask as a mask. In some embodiments, the remaining portions of the lower bit line material (i.e., the lower bit line layer 137) and the remaining portions of the upper bit line material (i.e., the upper bit line layer 139) have aligned sidewalls. After the bit line 141 is formed, the pattered mask may be removed.

In some embodiments, the lower bit line layer 137 is a single layer including doped polysilicon, metal, metal silicide, or metal compound. In some embodiments, the lower bit line layer 137 is a multilayer structure including any combination of the above materials. Similar to the lower bit line layer 137, the upper bit line layer 139 may be a single layer or a multilayer structure, which includes one or more metals or metal compounds.

Figure 16:
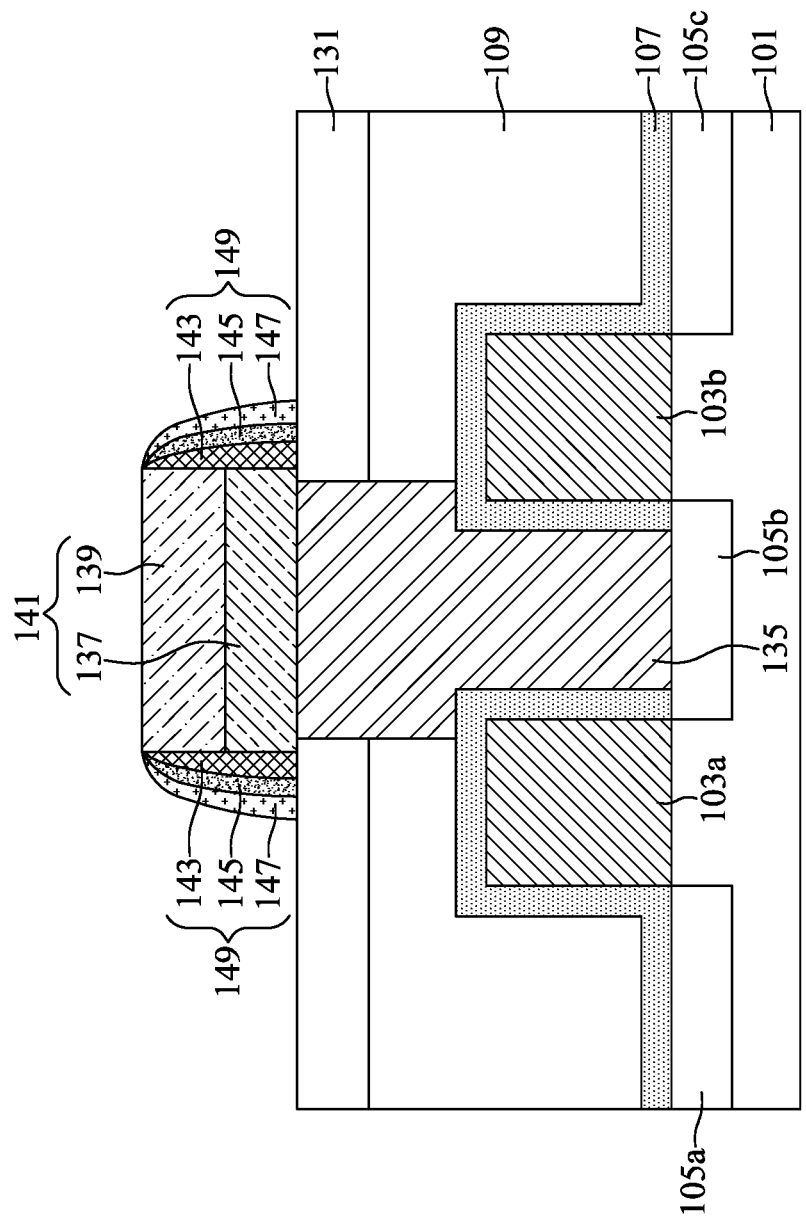
FIG. 16 is a cross-sectional view illustrating an intermediate stage of forming a spacer structure on opposite sides of the bit line during the formation of the semiconductor device, in accordance with some embodiments.

Subsequently, a spacer structure 149 including inner spacers 143, middle spacers 145 and outer spacers 147 are formed on opposite sidewalls of the bit line 141, as shown in FIG. 16 in accordance with some embodiments. The respective step is illustrated as the step S29 in the method 10 shown in FIG. 2. In some embodiments, the inner spacers 143 are in direct contact with the sidewalls of the bit line 141, and the middle spacers 145 are sandwiched between the inner spacers 143 and the outer spacers 147.

In some embodiments, the inner spacers 143 are made of high density carbon, the middle spacers 145 are made of doped oxide, and the outer spacers 147 are made of high density carbon, silicon carbide (SiC) or silicon carbon nitride (SiCN), although any other materials may alternatively be utilized. In some embodiments, the formation of the inner spacers 143 includes conformally depositing an inner spacer material (not shown) on the top surface and the sidewalls of the bit line 141 and on the top surface of the patterned mask 131. The deposition process may include a CVD process, a PVD process, an ALD process, a spin-on coating process, or another applicable process. Then, the inner spacer material may be etched by an anisotropic etching process, which removes the same amount of the spacer material vertically in all places, leaving the inner spacers 143 on the sidewalls of the bit line 141. In some embodiments, the etching process is a dry etching process. Some processes used to form the middle spacers 145 and the outer spacers 147 are similar to, or the same as those used to form the inner spacers 143, and details thereof are not repeated herein.

Figure 17:
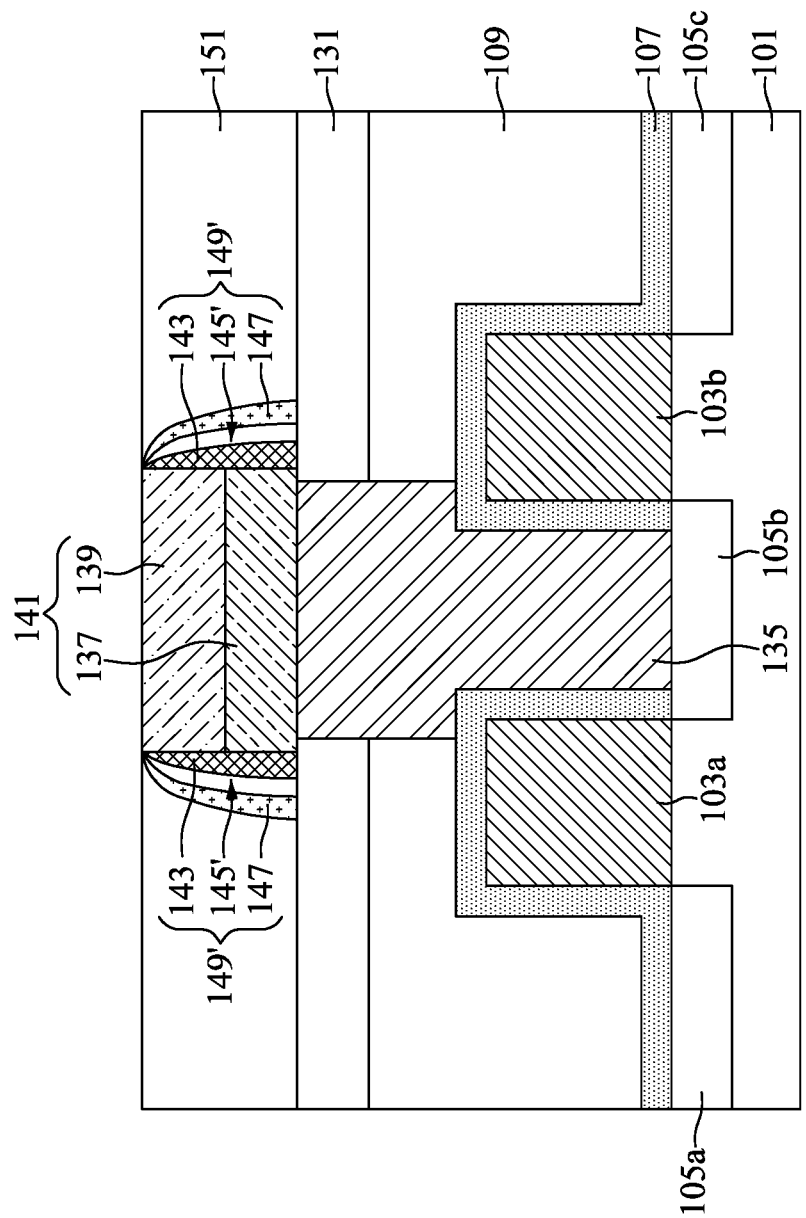
FIG. 17 is a cross-sectional view illustrating an intermediate stage of forming a dielectric layer surrounding the spacer structure and forming air spacers in the spacer structure during the formation of the semiconductor device, in accordance with some embodiments.

Next, the dielectric layer 151 is formed surrounding the spacer structure 149, an planarization process such as a CMP process is performed to expose the top end of the middle spacers 145, and the middle spacers 145 are then removed such that a resulting spacer structure 149' with air spacers 145' is formed, as shown in FIG. 17 in accordance with some embodiments. Some processes and materials used to form the dielectric layer 151 are similar to, or the same as those used to form the dielectric layer 109, and details thereof are not repeated herein.

In some embodiments, the middle spacers 145 are removed by a vapor phase hydrofluoric acid (VHF) etching process. However, any other suitable method may alternatively be used to form the air spacers 145'. For example, when the middle spacers 145 are made of an energy removable material, a heat treatment process can be performed to transform the middle spacers 145 into the air spacers 145'. In some embodiments, the energy removable material includes a base material and a decomposable porogen material that is substantially removed once being exposed to an energy source (e.g., heat). In some embodiments, the heat treatment process can be replaced by a light treatment process, an e-beam treatment process, a combination thereof, or another applicable energy treatment process.

Figure 18:
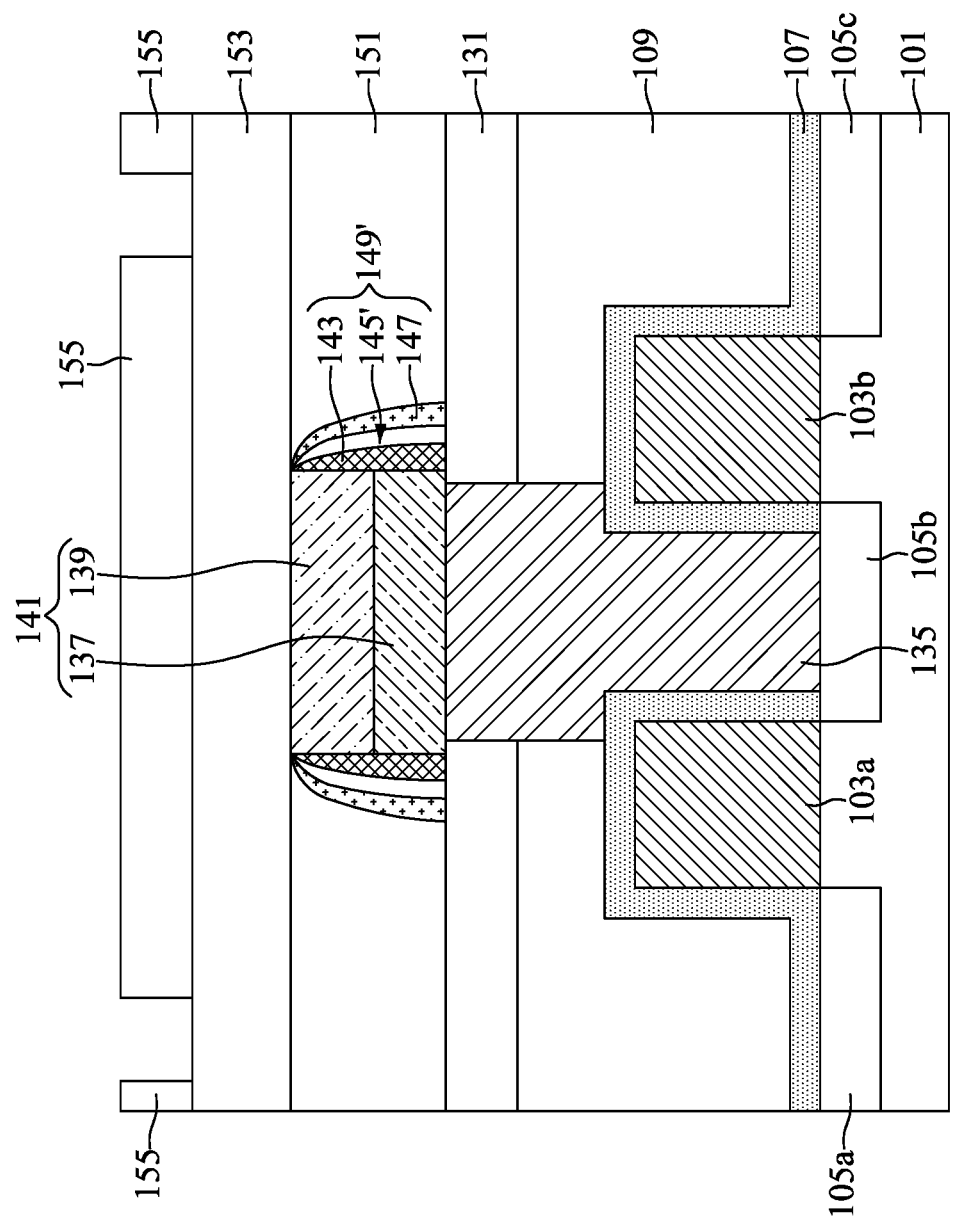
FIG. 18 is a cross-sectional view illustrating an intermediate stage of forming a dielectric layer covering the air spacers and forming a patterned mask over the dielectric layer during the formation of the semiconductor device, in accordance with some embodiments.

After the air spacers 145' are formed, the dielectric layer 153 is formed over the dielectric layer 151 to seal the air spacers 145', and a patterned mask 155 is formed over the dielectric layer 153, as shown in FIG. 18 in accordance with some embodiments. Some processes and materials used to form the dielectric layer 153 are similar to, or the same as those used to form the dielectric layer 109, and details thereof are not repeated herein. In some embodiments, the patterned mask 155 has openings exposing the portions of the dielectric layer 153 directly above the source/drain regions 105a and 105c.

Figure 19:
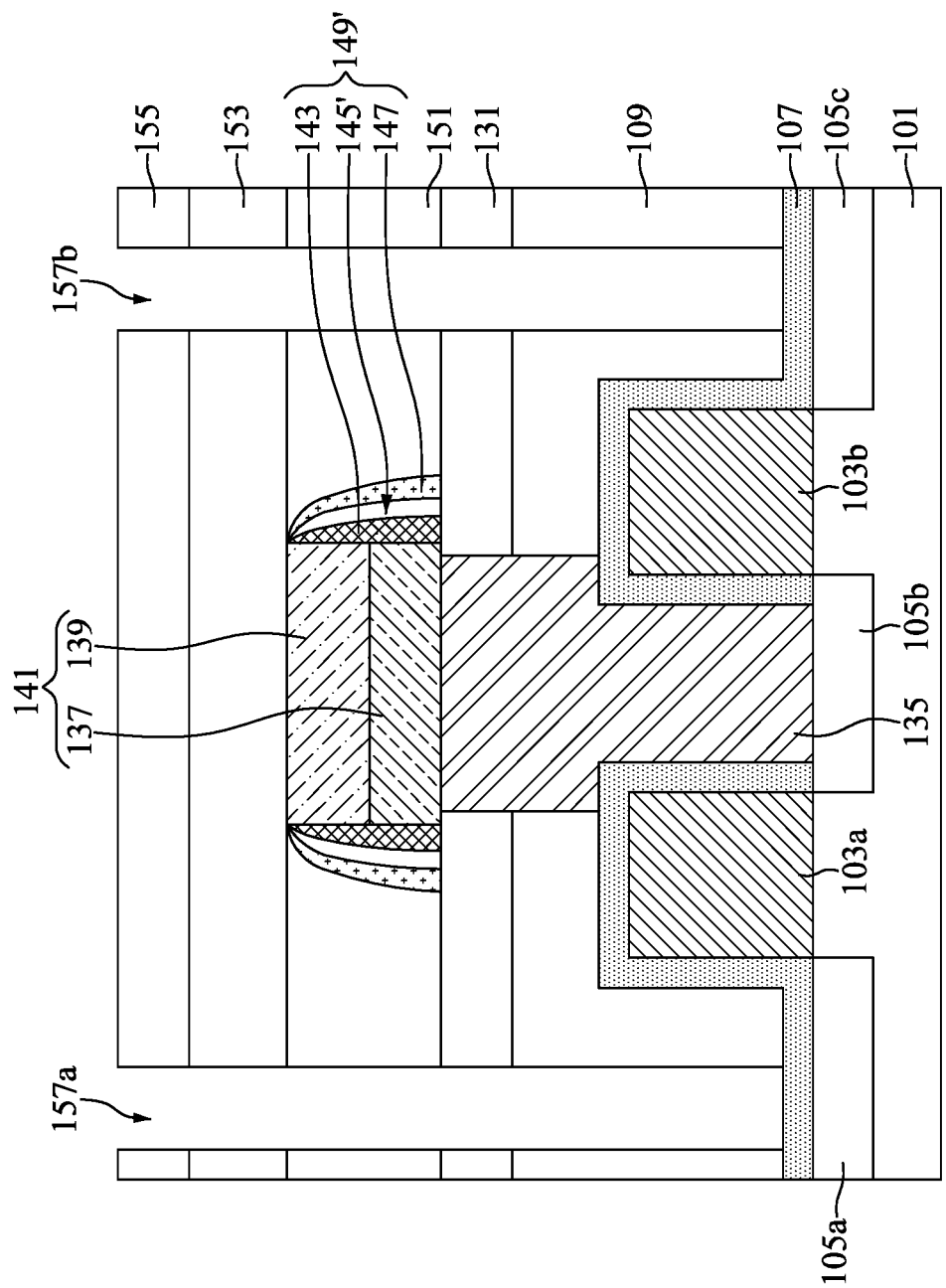
FIG. 19 is a cross-sectional view illustrating an intermediate stage of etching the underlying dielectric layers to form openings by using the patterned mask as a mask during the formation of the semiconductor device, in accordance with some embodiments.

Then, an etching process is performed to form openings 157a and 157b using the patterned mask 155 as a mask, as shown in FIG. 19 in accordance with some embodiments. In some embodiments, the carbon liner 107 is used as an etch stop layer in the etching process, such that the top surfaces of the portions of the carbon liner 107 covering the source/drain regions 105a and 105c are exposed in the openings 157a and 157b, respectively. As a result, the dielectric layers 153, 151 and 109, and the patterned mask 131 are partially removed by the etching process, while the carbon liner 107 may be substantially left. In some embodiments, the etching process is a dry etching process.

Figure 20:
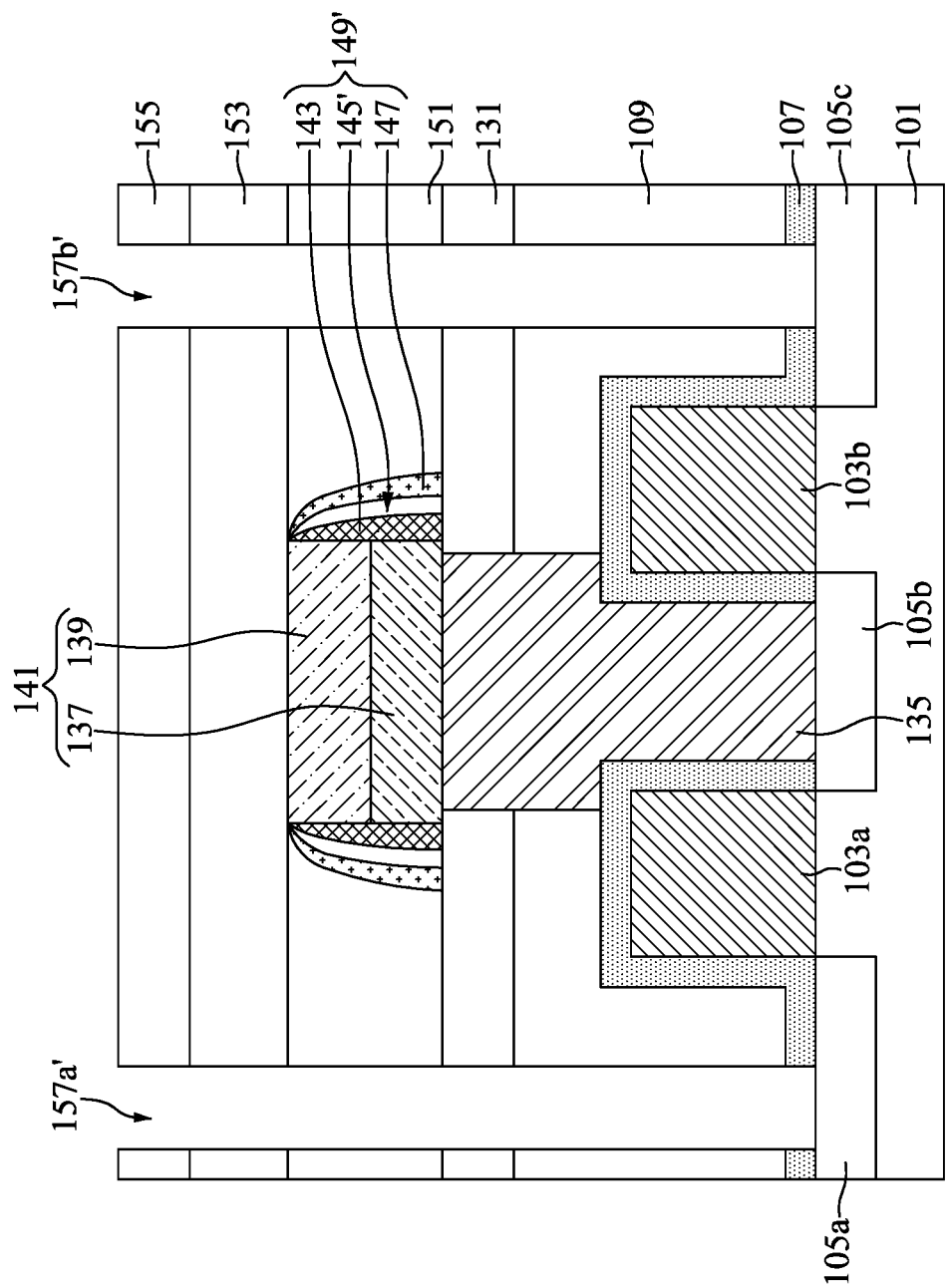
FIG. 20 is a cross-sectional view illustrating an intermediate stage of etching the carbon liner through the openings during the formation of the semiconductor device, in accordance with some embodiments.

Subsequently, an etching process is performed to remove the portions of the carbon liner 107 covering the source/drain regions 105a and 105c through the openings 157a and 157b, as shown in FIG. 20 in accordance with some embodiments. In other words, the openings 157a and 157b are deepened, such that openings 157a' and 157b' exposing the source/drain regions 105a and 105c are obtained. In some embodiments, the etching process is a dry etching process. Moreover, as illustrated, the patterned mask 155 remains after the etching process. However, in other embodiments, the patterned mask 155 can be removed after the openings 157a' and 157b' are obtained.

Next, the capacitor contacts 159a and 159b are formed in the openings 157a' and 157b', as shown in FIGS. 21 and 22 in accordance with some embodiments. In some embodiments, the capacitor contacts 159a and 159b penetrating through the patterned masks 155 and 131, the dielectric layers 153, 151 and 109, and the carbon liner 107. The respective step is illustrated as the step S31 in the method 10 shown in FIG. 2. The formation of the capacitor contacts 159a and 159b may include forming a conductive material (not shown) in the openings 157a' and 157b' and extending over the patterned mask 155, and performing a planarization process to remove excess portions of the conductive material over the patterned mask 155, such that the capacitor contacts 159a and 159b (i.e., the remaining portions of the conductive material) are obtained in the openings 157a' and 157b'.

In some embodiments, the conductive material for forming the capacitor contacts 159a and 159b are made of a low resistivity conductive material, such as copper (Cu), tungsten (W), aluminum (Al), titanium (Ti), tantalum (Ta), gold (Au), silver (Ag), a combination thereof, or another applicable conductive material. The conductive material for forming the capacitor contacts 159a and 159b may be formed by a CVD process, a PVD process, a sputtering process, a plating process, or another applicable process, and the planarization process for forming the capacitor contacts 159a and 159b may include a CMP process.

Referring back to FIG. 1, after the capacitor contacts 159a and 159b are formed, the dielectric layer 161 is formed over the patterned mask 155, and the capacitors 169a and 169b are formed in the dielectric layer 161 and over the capacitor contacts 159a and 159b, in accordance with some embodiments. The respective step is illustrated as the step S33 in the method 10 shown in FIG. 2. In some embodiments, the capacitors 169a and 169b are MIM capacitors. Specifically, the capacitor 169a includes the conductive layer 163a, the dielectric layer 165a disposed over the conductive layer 163a, and the conductive layer 167a disposed over the dielectric layer 165a, and the capacitor 169b includes the conductive layer 163b, the dielectric layer 165b disposed over the conductive layer 163b, and the conductive layer 167b disposed over the dielectric layer 165b.

Some materials and processes used to form the dielectric layer 161 are similar to, or the same as those used to form the dielectric layer 109, and details thereof are not repeated herein. The formation of the capacitors 169a and 169b may include etching the dielectric layer 161 to form openings (not shown) exposing the capacitor contacts 159a and 159b, sequentially depositing a conductive material, a dielectric material and another conductive material in the openings and extending over the dielectric layer 161, and performing a planarization process (e.g., a CMP process) to remove excess portions of the two conductive materials and the dielectric material. In some embodiments, the conductive layers 163a and 163b include titanium nitride (TiN), the dielectric layers 165a and 165b include a dielectric material, such as silicon dioxide ($SiO_2$), hafnium dioxide ($HfO_2$), aluminum oxide ($Al_2O_3$), zirconium dioxide ($ZrO_2$), or a combination thereof, and the conductive layers 167a and 167b include titanium nitride (TiN), low-stress silicon-germanium (SiGe), or a combination thereof.

In some embodiments, the capacitor 169a is electrically connected to the source/drain region 105a through the capacitor contact 159a, and the capacitor 169b is electrically connected to the source/drain region 105c through the capacitor contact 159b. After the capacitors 169a and 169b are formed, the semiconductor device 100 is obtained. In some embodiments, the semiconductor device 100 is part of a dynamic random access memory (DRAM).

Embodiments of a semiconductor device and method for fabricating the same are provided in the disclosure. The semiconductor device includes a gate structure and a bit line contact disposed over a semiconductor substrate, and a carbon liner disposed over a top surface and sidewalls of the gate structure. The bit line contact is electrically separated from the gate structure by the carbon liner. In comparison with other material layers (e.g., silicon nitride (SiN)), a lower stress in the carbon liner is desirable in order to provide a good adhesion between the carbon liner and the gate structure. Moreover, the etching selectivity between the carbon liner and the overlying dielectric layer is high. Therefore, the gate structure can be protected by the carbon liner during the subsequent etching process for forming the bit line contact. As a result, undesirable short circuit between the gate structure and the bit line contact may be prevented, and the device performance may be improved.

In one embodiment of the present disclosure, a semiconductor device is provided. The semiconductor device includes a gate structure disposed over a semiconductor substrate. The semiconductor device also includes a carbon liner covering a top surface and sidewalls of the gate structure and a top surface of the semiconductor substrate. The semiconductor device further includes a bit line contact disposed over the semiconductor substrate. The bit line contact extends over the gate structure, and the bit line contact is electrically separated from the gate structure by the carbon liner.

In another embodiment of the present disclosure, a semiconductor device is provided. The semiconductor device includes a first gate structure and a second gate structure disposed over a semiconductor substrate. The semiconductor device also includes a bit line contact disposed over the semiconductor substrate and between the first gate structure and the second gate structure. The semiconductor device further includes a carbon liner covering the first gate structure and the second gate structure. The bit line contact is electrically separated from the first gate structure and the second gate structure by the carbon liner. In addition, the semiconductor device includes a dielectric layer disposed over the carbon liner. The bit line contact penetrates through the dielectric layer.

In yet another embodiment of the present disclosure, a method for fabricating a semiconductor device is provided. The method includes forming a first gate structure over a semiconductor substrate, and forming a first source/drain region in the semiconductor substrate. The first source/drain region is adjacent to the first gate structure. The method also includes conformally depositing a carbon liner over the first gate structure and the semiconductor substrate, and forming a dielectric layer over the carbon liner. The method further includes forming a bit line contact penetrating through the dielectric layer and the carbon liner. The bit line contact is electrically connected to the first source/drain region, and the bit line contact is separated from the first gate structure by the carbon liner.

The embodiments of the present disclosure have some advantageous features. By forming the carbon liner over the gate structures, the gate structures may be protected from being exposed or damaged during the subsequent etching process for forming the bit line contact. As a result, undesirable short circuit between the gate structure and the bit line contact may be prevented, and the device performance may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
    forming a first gate structure over a semiconductor substrate;
    forming a first source/drain region in the semiconductor substrate, wherein the first source/drain region is adjacent to the first gate structure;
    conformally depositing a carbon liner over the first gate structure and the semiconductor substrate;
    forming a dielectric layer over the carbon liner;
    performing a first etching process to form an opening in the dielectric layer, wherein a portion of the carbon liner on sidewalls of the first gate structure is exposed by the opening, and a top surface of a portion of the carbon liner covering the first source/drain region is exposed by the opening;
    performing a second etching process to remove the portion of the carbon liner covering the first source/drain region; and
    forming a bit line contact penetrating through the dielectric layer and the carbon liner, wherein the bit line contact is electrically connected to the first source/drain region, and wherein the bit line contact is separated from the first gate structure by the carbon liner;
    wherein the first etching process and the second etching process are dry etching processes.

2. The method for fabricating a semiconductor device of claim 1, wherein a top surface and sidewalls of the first gate structure are entirely covered by the carbon liner after the bit line contact is formed.

3. The method for fabricating a semiconductor device of claim 1, wherein an etching selectivity exists between the carbon liner and the dielectric layer, such that the first source/drain region is entirely covered by the portion of the carbon liner during the first etching process.

4. The method for fabricating a semiconductor device of claim 1, further comprising:
   forming a second source/drain region in the semiconductor substrate, wherein the first source/drain region and the second source/drain region are on opposite sides of the first gate structure; and
   forming a capacitor contact penetrating through the dielectric layer and the carbon liner, wherein the capacitor contact is electrically connected to the second source/drain region.

5. The method for fabricating a semiconductor device of claim 1, further comprising:
   forming a second gate structure between the semiconductor substrate and the carbon liner, wherein the first source/drain region is between the first gate structure and the second gate structure, and the bit line contact is separated from the second gate structure by the carbon liner.

6. A method for fabricating a semiconductor device, comprising:
   forming a first gate structure over a semiconductor substrate;
   forming a first source/drain region in the semiconductor substrate, wherein the first source/drain region is adjacent to the first gate structure;
   conformally depositing a carbon liner over the first gate structure and the semiconductor substrate;
   forming a dielectric layer over the carbon liner;
   performing a first etching process to form an opening in the dielectric layer, wherein a portion of the carbon liner on sidewalls of the first gate structure is exposed by the opening, and a top surface of a portion of the carbon liner covering the first source/drain region is exposed by the opening;
   performing a second etching process to remove the portion of the carbon liner covering the first source/drain region;
   performing a third etching process on the dielectric layer to broaden an upper portion of the opening such that a topmost surface of the carbon liner is partially exposed, wherein the first gate structure is entirely covered by the carbon liner during the third etching process; and
   forming a bit line contact penetrating through the dielectric layer and the carbon liner, wherein the bit line contact is electrically connected to the first source/drain region, and wherein the bit line contact is separated from the first gate structure by the carbon liner.

7. The method for fabricating a semiconductor device of claim 6, wherein the bit line contact is formed in the opening after the upper portion of the opening is broadened, and the bit line contact covers the topmost surface of the carbon liner.

* * * * *